United States Patent

Hirano et al.

[11] Patent Number: 5,801,447
[45] Date of Patent: Sep. 1, 1998

[54] FLIP CHIP MOUNTING TYPE SEMICONDUCTOR DEVICE

[75] Inventors: Naohiko Hirano; Kazuhide Doi, both of Kawasaki; Chiaki Takubo, Yokohama; Hiroshi Tazawa, Ichikawa; Eiichi Hosomi, Kawasaki; Yoichi Hiruta, Kashiwa; Takashi Okada; Koji Shibasaki, both of Kawasaki, all of Japan

[73] Assignee: Kabushiki Kaisha Toshiba, Kawasaki, Japan

[21] Appl. No.: 637,242

[22] Filed: Apr. 24, 1996

[30] Foreign Application Priority Data

Apr. 25, 1995 [JP] Japan .................................. 7-124313

[51] Int. Cl.$^6$ ................................................ H01L 23/48
[52] U.S. Cl. ..................... 257/778; 257/786; 257/787
[58] Field of Search ............................ 257/787, 778, 257/786, 618

[56] References Cited

U.S. PATENT DOCUMENTS 4,021,838  5/1977  Warwick .......................... 257/778
5,647,123  7/1997  Greenwood et al. ............... 257/787

*Primary Examiner*—Tom Thomas
*Assistant Examiner*—Roy Potter
*Attorney, Agent, or Firm*—Finnegan, Henderson, Farabow, Garrett & Dunner, L.L.P.

[57] ABSTRACT

In a flip chip mounting type semiconductor device, on a corner portion of a chip subjected to flip chip mounting, a gate region for injecting a sealing member filled between a mounted board and the chip is arranged. In this semiconductor device, a semiconductor element has a plurality of bumps formed on the peripheral portion on a major surface along each side, a plurality of pad electrodes are formed on the major surface of the circuit board, and the pad electrodes join the bumps. A resin sealing member is filled between the semiconductor element and the circuit board. A gate region through which the resin sealing member is injected is formed on a corner portion of the semiconductor element. In the gate region, no bump is formed, or bumps are arranged at intervals smaller than that in another region. For this reason, the resin uniformly enters the space between the semiconductor element and the circuit board through the gate region.

5 Claims, 5 Drawing Sheets

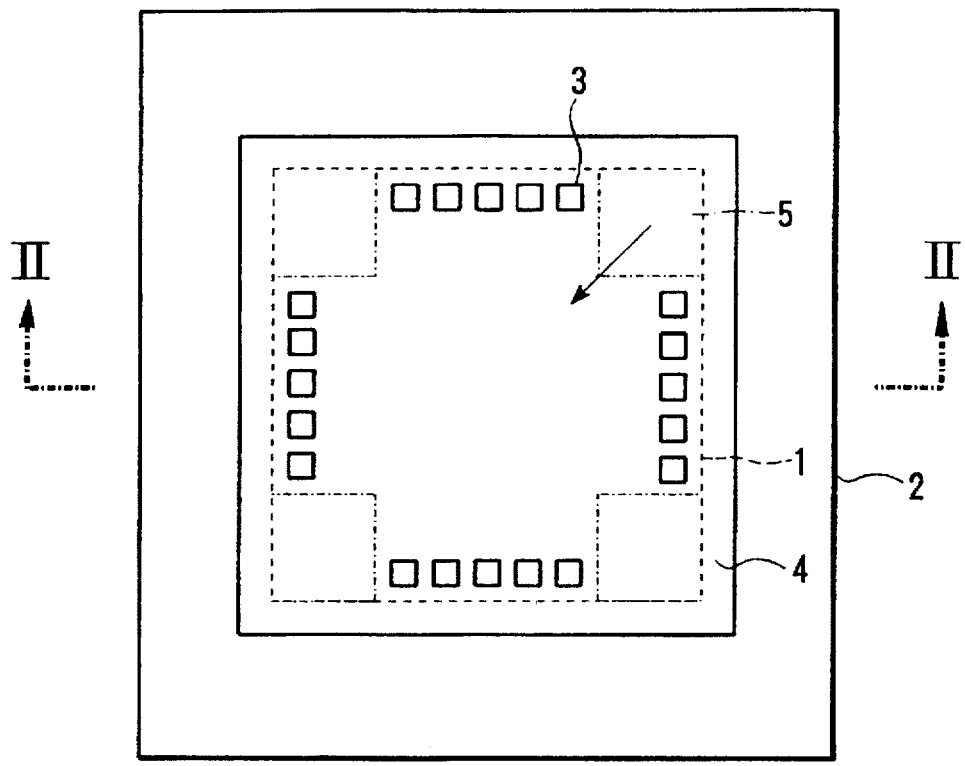
F I G. 1
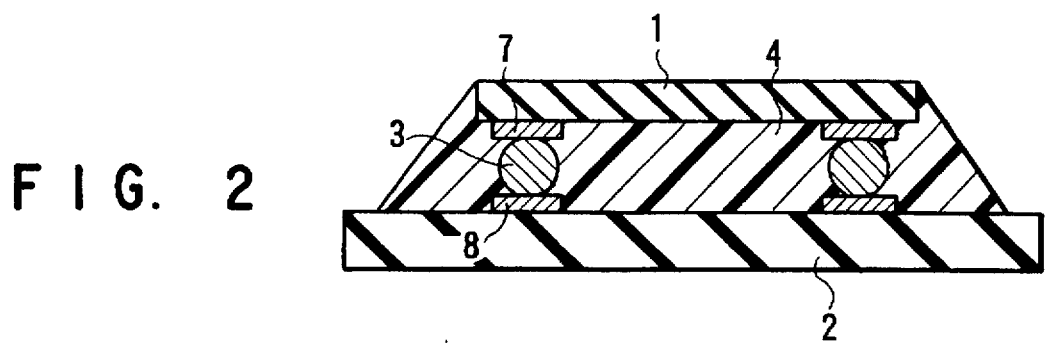
F I G. 2
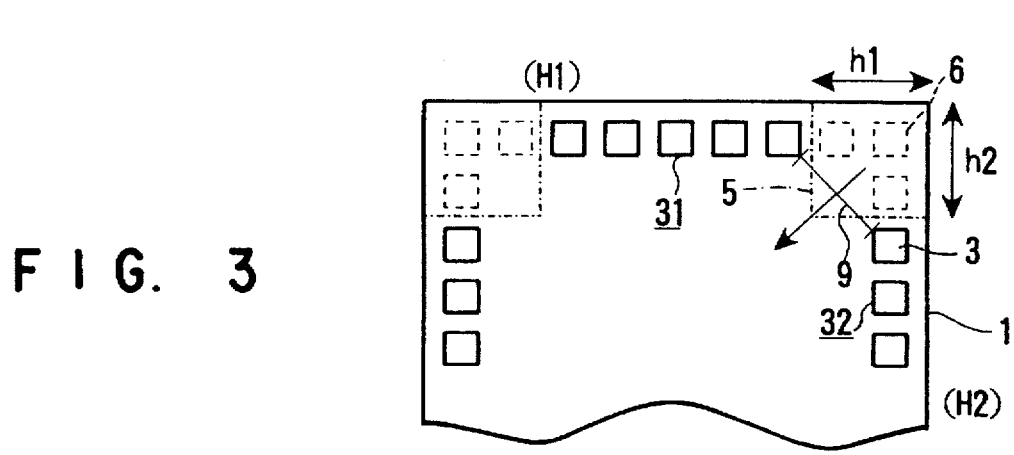
F I G. 3

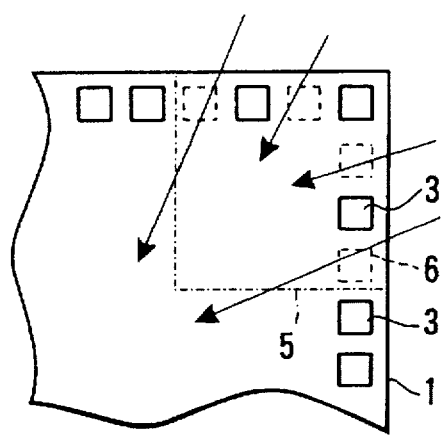
F I G. 4
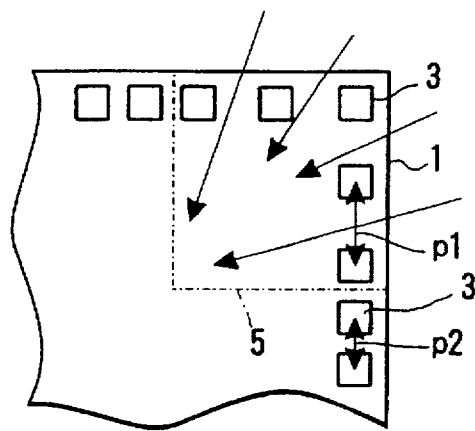
F I G. 5
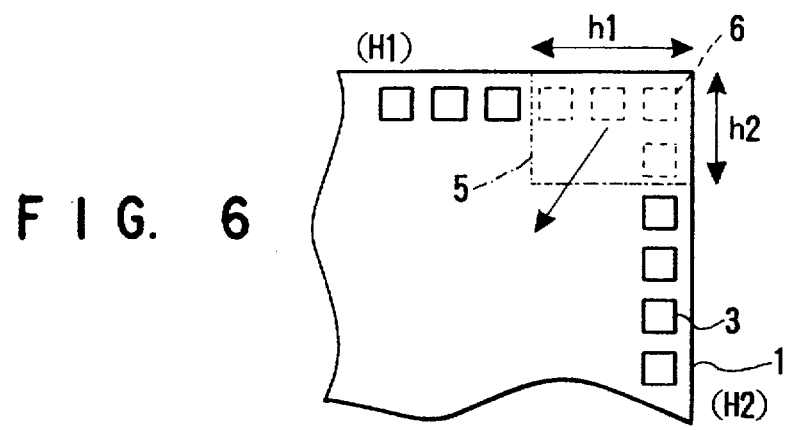
F I G. 6
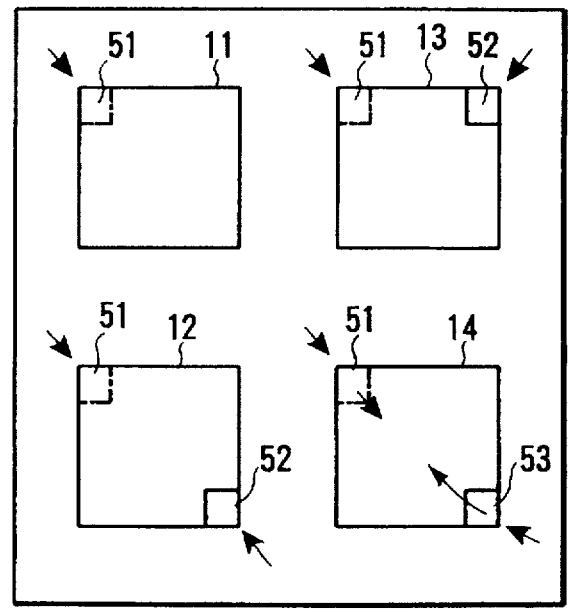
F I G. 7

FLIP CHIP MOUNTING TYPE SEMICONDUCTOR DEVICE

BACKGROUND OF THE INVENTION

1. Field of the Invention

The present invention relates to a flip chip mounting type semiconductor device and, more particularly, to the structure of a projection electrode of a semiconductor element whose filling resin injection properties are improved, and a method of manufacturing the same.

2. Description of the Related Art

Conventionally, in order to mount a semiconductor element on a circuit board, the following methods are used. That is, a plurality of lead ends are led from the semiconductor element (to be referred to as a chip hereinafter) and bonded to wiring patterns on the circuit board, or a semiconductor element is directly mounted on a circuit board and connected thereto by wire bonding or TAB (Tape Automated Bonding). However, bonding a lead projecting from a chip to a circuit board largely hinders high-density mounting of a semiconductor device. In particular, in recent years, application of a semiconductor device has become diversified, and, accordingly, high-density mounting has advanced. For example, a thin circuit board is used in a memory card, or the number of mounted memory elements tends to increase. In the above circumstances, mounting of a chip by using leads is limited. Therefore, a flip chip method in which a plurality of connection electrodes formed on a chip are directly connected to the wiring patterns of the circuit board attracts attention.

FIGS. 11A and 11B are sectional views showing steps in manufacturing a conventional semiconductor obtained by flip chip mounting a silicon chip on a circuit board, and FIG. 12 is a sectional view showing the manufactured semiconductor device. A chip 1 has, on its surface, a pad electrode 7 which is used as a connection electrode electrically connected to an integrated circuit formed in the chip 1, and has a projection electrode (bump) 3 connected on the pad electrode 7. The bump 3 is constituted by a solder bump made of a low-melting-point metal containing Pb or Sn as a main component, and has a height of about 100 µm. The bumps 3 are arranged at the surface peripheral portion of the chip 1 along each side of the chip. At least one chip 1 is mounted on a circuit board 2. The chip 1 is mounted on the circuit board 2 in such a manner that a plurality of bumps 3 on the chip 1 are electrically connected to pad electrodes (to be referred to as board-on pads hereinafter) 8 connected to wiring patterns (not shown) formed on the surface of the circuit board 2. The bumps 3 may be formed of a low-melting-point metal or a metal, or may be constituted by an electrode obtained by forming a conductive film on the surface of an insulating spherical member. As the low-melting-point metal, a Pb—Sn solder or In—Sn solder is known. As the circuit board 2, a printed board constituted by stacking epoxy-resin-impregnated glass substrates, a ceramic substrate, a silicon semiconductor substrate, or the like. As shown in FIG. 12, a resin sealing member 4 is filled between the chip 1 and the circuit board 2.

A semiconductor device is heated by heat generated in a chip while the semiconductor device is operated. The heat generated in the chip is transmitted to the circuit board through the bump to make the temperature of the circuit board high. As a result, the chip and the circuit board thermally expand. In the flip chip mounting, when the chip 1 and the circuit board 2 have different thermal expansion coefficients, respectively, thermal stress generated thereby is concentrated on the bump 3. In order to moderate this stress, the resin sealing member 4 is filled between the chip 1 and the circuit board 2 to perform resin sealing therebetween.

A conventional method of the step performed from when the chip 1 is placed on the circuit board 2 to when the resin sealing is performed will be described below. The bump 3 connected to the pad electrode 7 of the chip 1 is placed on the board-on pad 8 on the circuit board 2 (FIG. 11A). The bump 3 is reflowed to connect the bump 3 to the board-on pad 8 (FIG. 11B). The resin sealing member 4 such as an epoxy resin or polyimide is poured into a gap between the chip 1 and the circuit board 2. The poured resin is hardened to adhere the chip 1 to the circuit board 2 (FIG. 12).

As described above, in the flip chip mounting, resin sealing is ordinarily performed to assure long-time reliability of a semiconductor device. In the flip chip mounting including resin sealing, the physical values must be optimally selected to moderate stress concentrated on a solder bump. It is generally known that a resin having a thermal expansion coefficient close to that of a solder is used as the material of a resin-sealing member. The physical values of the resin depend on the content of a filler which the resin contains. The size of the filler falls within the range of several µm to several 10 µm, generally, about 10 to 20 µm.

However, when the connection pitch of the flip chip mounting decreases, a space between solder bumps and a space between a chip and a circuit board decreases accordingly. At this time, even if a resin having optimum physical values such as Young's modulus is selected, the resin cannot enter the gap between the circuit board and the chip because the size of the filler in the resin is large. This problem arises when a fine connection pitch of 100 µm or less is used. In addition, a resin containing no filler is used, a resin having optimum physical values cannot be found. Therefore, the long-time reliability of a semiconductor device is degraded.

Since the arrangement of board-on pads on the circuit board is determined depending on the arrangement of pad electrodes of the chip in a flip chip mounting scheme, the arrangement of the pad electrodes of the chip must be sufficiently considered. As described above, in the semiconductor device in which flip chip mounting is performed, bumps are ordinarily arranged (peripheral arrangement) on the peripheral portion on the chip surface. According to this method, bumps are arranged at substantially equal intervals on not only the peripheral portion on the major surface of the chip but also on the corner portions of the major surface of the chip.

In order to improve connection reliability, the size of the bump on each corner portion is set to be larger than that of the bump on other portions.

In order to avoid an increase in board cost or a cumbersome board process, a decrease in pitch of a bump arrangement must be prevented. A staggered arrangement of bumps is an effective arrangement, however a bump pitch, the number of bumps which can be arranged, and an arranging method have not been proposed in consideration a wiring formation technique.

In the flip chip mounting, in order to improve the reliability of connection of solder bumps, a resin must be filled in a gap between the chip and the board. A resin for improving reliability of the bump connection has a high filler content. For this reason, fluidity or workability of the resin itself tends to degrade. In order to use such high-reliability resin, a bump arrangement and bump pitch which do not prevent the injection properties of the resin are required.

FIG. 13 is a perspective view showing, through the chip, a conventional bump-arrangement on the peripheral portion of the surface of a chip mounted on the circuit board 2. FIGS. 14A and 14B are sectional views showing the structure in FIG. 13. The bumps 3 are arranged at substantially equal intervals on the major surface of is the chip 1 along the sides of the chip 1. The bumps 3, as described above, are fixed on pad electrodes (not shown in FIG. 13) electrically connected to the circuit elements of the chip 1. A resin is filled between the chip 1 and the circuit board 2 by using the capillary phenomenon between bumps or between the chip and the circuit board. Therefore, when the bump pitch or the gap between the chip and the circuit board is smaller than the size of each filler particle, the filler cannot pass through the portion between the bumps or the gap between the chip and the circuit. Therefore, resin filling properties are extremely degraded, an unfilled portion may be formed, or voids may be formed.

When a resin for the sealing member 4 is dropped from a nozzle (not shown), the resin enters the central portion of the chip 1 by the capillary phenomenon between the bumps 3 or between the chip 1 and the circuit board 2. If conditions are satisfied, the resin smoothly enters the space between the chip 1 and the circuit board 2, as shown in FIG. 14A. However, when conditions are not satisfied, the filling properties of the resin are degraded, and as shown in FIG. 14B, the resin does not enter the central portion of the chip 1. More specifically, the resin flows along the periphery of the bump arrays, and the resin cannot enter the space between the chip 1 and the circuit board 2 through the portion between the bumps 3. The unsatisfied conditions include a large filler particle size, a large filler content, a small bump pitch, a high resin viscosity, etc.

In addition, with respect to the pad arrangement, a pad pitch equal to that in the semiconductor chip can be realized on the board. However, for this purpose, a limited wiring-formation-technique such as a thin-film wiring technique is required, thereby increasing a board cost. Therefore, in order to cause the ordinary board formation technique to cope with a semiconductor element having a large number of pins and a small pitch, the pad arrangement must be determined in consideration of a wiring formation technique.

In particular, in pads arranged in a staggered form, unless a pad pitch, the number of bumps, a pad arrangement, etc., are properly set, a load on a board design increases. As a-result, a special wiring technique must be used, or the number of layers must be increased, thereby increasing the board cost.

FIG. 15 is a plan view showing a part of a circuit board, having pads arranged in a staggered form, for conventional flip chip mounting, and FIG. 16 is a sectional view showing mainly the circuit board along an XVI—XVI line of the circuit board in FIG. 15. As shown in FIG. 15, board-on pads 8 are arranged in a staggered form on the major surface of the circuit board 2. More specifically, two parallel pad arrays constituted by pads 8 are arranged on the peripheral portion of the major surface of the circuit board 2, and the pads of one array oppose portions between the pads of the other array, respectively. The pads 8 formed on the circuit board 2 coinside with bumps formed on the pad electrodes of the chip 1. Similarly, pads are formed in the staggered form on the peripheral portion of the surface of the chip 1. That is, two parallel pad arrays are arranged along the peripheral portion of the surface of the chip 1. An outer pad array 83 of the two parallel arrays has wires 81 arranged toward the outside of the circuit board 2. An inner pad array 84 has wires 81 arranged toward the inside of the circuit board 2.

These wires 81 extend to a land 22 formed around and inside through holes 21 of the circuit board 2, and are connected to wires 82 formed on the rear surface of the circuit board 2. The through holes 21 are arranged at a portion corresponding to the inside of the chip 1. When the through holes 21 are to be formed, lands each having a diameter larger than the through hole diameter is required. A land of this type often occupies the largest region in the wiring formation technique.

Therefore, in order to form a mounting board, a pad optimum arrangement form which does not consider a minimum pitch at which pad formation can be performed but limitation items such as a wire-land distance or a land-land distance. In addition, when a chip having pads arranged in a staggered form is mounted on the circuit board, pad arrangement which considers not only a board arrangement technique but also resin filling properties.

SUMMARY OF THE INVENTION

The present invention has been made in consideration of the above circumstances, and has as its object to provide a semiconductor device which has excellent filling properties and optimizes a bump arrangement, a bump pitch, or the number of bumps without increasing board cost.

The present invention is characterized in that a gate region for injecting a resin sealing member filled between a mounting board and a chip is arranged on a corner portion of a chip which is subjected to flip chip mounting. More specifically, a semiconductor device according to the present invention comprises a semiconductor element having a plurality of bumps formed along each side of the peripheral portion of the major surface, a circuit board having a major surface on a plurality of pad electrodes are formed and join the bumps, and a sealing member filled between the semiconductor element and the circuit board, wherein a gate region in which the sealing member is injected is formed on a corner portion of the semiconductor element. No bump may be formed in the gate region. The plurality of bumps are arranged on the major surface of the semiconductor element at predetermined intervals, and the interval between the bumps in the gate region may be set to be larger than the interval between the bumps in another region. The shape of the gate region may be a square or rectangular having two adjacent sides constituting a corner of the semiconductor element. The plurality of bumps may be arranged in a staggered form.

According to the present invention, a method of manufacturing a semiconductor device is further provided, which comprises the step of forming a plurality of bumps formed along sides of a peripheral portion on a major surface of a semiconductor element, the step of forming a circuit board having a major surface in which a plurality of pad electrode are formed and join the bumps of the semiconductor element, and the step of injecting a resin from a gate region formed at least one corner portion of the semiconductor element into a portion between the semiconductor element and the circuit board to form a sealing member therebetween.

Since no bump is formed in the gate region, or a bump interval in the gate region is set to be larger than that in another region, the resin injected from this region uniformly enters a portion between the chip and the circuit board. In addition, when a resin is to be injected in the portion between the chip and the circuit board, a gate region through which the resin is injected is arranged on a selected corner portion or portions, rather than that resin injection is performed from all the corner portions. Therefore, the flow of resin is not disturbed, and the resin is further uniformly filled in the gap between the semiconductor chip and the circuit board. When the gate region has two adjacent sides which are different in length, a resin injection direction in this gate region can be made different from a resin injection direction in a gate region which has two adjacent sides which are equal to each other in length. As a result, the flow of resin is not disturbed, and resin sealing can be uniformly performed without voids.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a plan view showing a semiconductor device according to a first embodiment of the present invention;

FIG. 2 is a sectional view showing a portion along an II—II line in FIG. 1;

FIG. 3 is a plan view showing a part of a semiconductor chip used in the semiconductor device in FIG. 1;

FIG. 4 is a plan view showing a part of a semiconductor chip used in a semiconductor device according to a second embodiment;

FIG. 5 is a plan view showing a part of a chip used in a semiconductor device according to a third embodiment;

FIG. 6 is a plan view showing a part of a semiconductor chip used in a semiconductor device according to a fourth embodiment;

FIG. 7 is a plan view showing a semiconductor device according to a fifth embodiment;

DETAILED DESCRIPTION OF THE PREFERRED EMBODIMENTS

Figure 8:
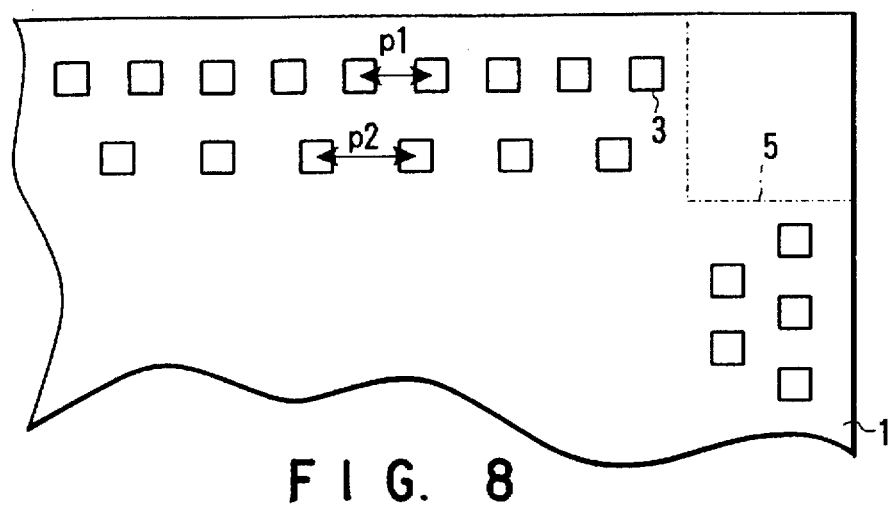
FIG. 8 is a plan view showing a part of a semiconductor chip used in a semiconductor device according to a sixth embodiment.

Embodiments of the present invention will be described below with reference to the accompanying drawings.

The first embodiment of the present invention will be described first with reference to FIGS. 1 to 3.

FIG. 1 is a plan view showing a semiconductor device, particularly, a bump portion thereof, in which a semiconductor chip of, e.g., silicon, is flip chip mounted on a circuit board, FIG. 2 is a sectional view showing the semiconductor device along an II—II line in FIG. 2, and FIG. 3 is a plan view showing a part of a chip. As shown in FIG. 2, a chip 1 comprises, on its surface, a pad electrode 7 made of, for example, Al, electrically connected to an integrated circuit (not shown) in the chip 1, used as a connection electrode, and a bump 3, connected on the pad electrode 7 and constituted by a solder bump made of a low-melting-point metal containing Pb or Sn as a main component. The height of the bump 3 falls within the range of about 50 μm to 150 μm, generally, about 100 μm. The bumps 3 are arranged along the sides of the peripheral portion on a surface of the chip. At least one chip 1 is mounted on a circuit board 2. The plurality of bumps 3 on the chip 1 are electrically connected to pads 8, on the board, connected to wiring patterns (not shown) formed on the surface of the circuit board 2. The bump 3 may comprise gold rather than the low-melting-point metal, or may be constituted by an electrode obtained by forming a conductive layer on the surface of an insulating peripheral member. However, the melting temperature of the bump 3 is preferably as low as possible, and therefore, a low-melting-pint metal is preferably used.

As the low-melting-point metal, a Pb—Sn solder, an In—Sn solder, or the like is known. As the circuit board 2, a printed board obtained by stacking epoxy-resin-impregnated glass substrates, a ceramic substrate, a silicon semiconductor substrate, or the like is used. As shown in FIG. 2, a sealing member 4 such as an epoxy resin is filled in a gap between the chip 1 and the circuit board 2. The sealing member 4 is filled in the portion between the chip 1 and the circuit board 2 to moderate thermal stress. As shown in FIG. 1, gate regions 5 are formed on all the corners on a major surface, of the chip 1, on which the bumps 3 are formed. The resin is injected from at least one of the four gate regions 5 into a space between the chip and the board.

In this embodiment, the gate regions 5 are arranged on all the four corner portions. However, according to the present invention, the gate regions 5 need not be formed on all the corner portions, and a gate region may be formed on only a predetermined corner portion or portions.

On the corner portion of the chip 1, the gate region 5 has a substantially square shape. More specifically, as shown in FIG. 3, one gate region 5 of the chip 1 at a corner constituted by a first side (h1) and a second side (h2) adjacent to the first side, the length hi of the gate region along the first side is equal to the length h2 of the gate region along the second side (h1=h2). No bump 3 is arranged in the gate regions 5.

In a conventional chip, as indicated by a dotted line in FIG. 3 on a corner portion, bumps 6 are arranged. For this reason, a resin cannot enter the space between the chip 1 and the circuit board 2, and this portion cannot function as a gate region. Since, according to this embodiment, no bump is formed in the gate region, the resin can easily enter the space between the chip and the circuit board by a capillary phenomenon between the chip and the circuit board as indicated by an arrow in FIG. 3. In this gate region 5, three bumps 6 which are conventionally arranged are removed.

A diameter of the bumps ordinarily falls within the range of about 100 to 240 μm, and a pitch of the bumps (distance between the centers of two adjacent bumps of a bump array) is 200 to 300 μm or more. The length of one side of the gate regions 5 of the chip 1 is preferably set to be about 200 μm to 1 mm. If the length is larger than 1 mm, a resin easily enters the space between the chip 1 and the circuit board 2, but the number of bumps undesirably decreases. In such a gate region 5, as shown in FIG. 3, an opening 9 into which the resin flows is present between the nearest bumps of a first bump array 31 and a second bump array 32. The diameter of the opening 9 is approximately 250 μm to 1 mm. The resin substantially vertically enters the opening 9 as indicated by the arrow.

Figure 11A:
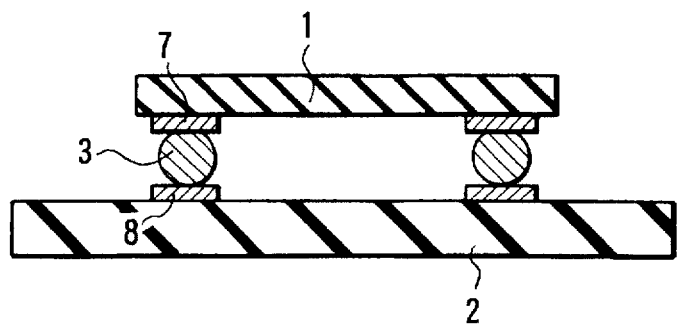
FIGS. 11A and 11B are sectional views showing the steps in manufacturing a conventional semiconductor device.
Figure 11B:
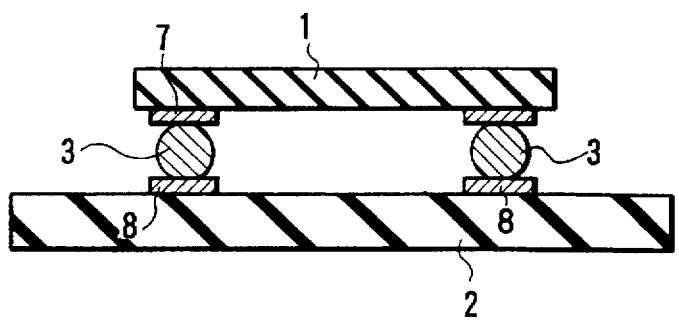
Figure 12:
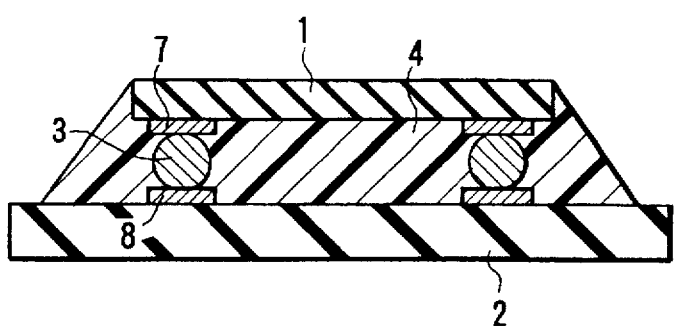
FIG. 12 is a sectional view showing a conventional semiconductor device.
Figure 13:
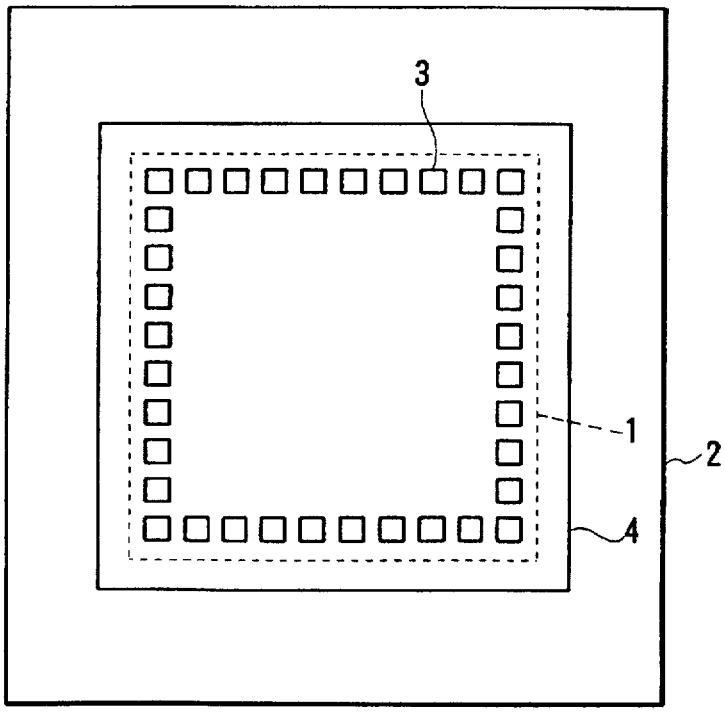
FIG. 13 is a plan view showing a conventional semiconductor device.

The step of mounting the chip to the circuit board (this step is the same as the conventional step) and the steps performed until resin sealing between the chip and the circuit board will be described below with reference to FIGS. 2 and 3 and FIGS. 11A and 11B. The bump 3 connected to the pad electrode 7 of the chip 1 is temporarily placed on the board-on pad 8 on the circuit board 2 temporarily (FIG. 11A). The bump 3 is reflowed to connect the bump 3 to the board-on pad 8 (FIG. 11B). The sealing member 4 of an epoxy resin or polyimide is poured from the gate region 5 into a space between the chip 1 and the circuit board 2 (FIG. 3). The poured resin is hardened to adhere the chip 1 to the circuit board 2, as shown in FIG. 2.

In the flip chip mounting, as described above, resin sealing is ordinarily performed to assure long-time reliability of a semiconductor device. In the flip chip mounting including resin sealing, the physical values must be optimally selected to moderate stress concentrated on a solder bump. It is generally known that a resin having a thermal expansion coefficient close to that of a solder is used as the material of a resin-sealing member. The size of the filler falls within the range of several μm to several 10 μm, generally, about 10 to 20 μm.

The present invention is suitably applied to sealing of a filler-containing resin. When an epoxy resin is used as a sealing member, Young's modulus of 3,500 MPa at a filler content of 0 wt %; 6,000 MPa at a filler content of 40 wt %; and 9,500 MPa at a filler content of 63 wt %. The viscosity in resin filling is 15 Pa.s at a room temperature and a filler content of 0 wt %, and 50 Pa.s at a filler content of 63 wt %. An adding rate of a filler to a resin is preferably set to be lower than about 70 wt % to moderate stress concentrated on bumps.

Figure 14A:
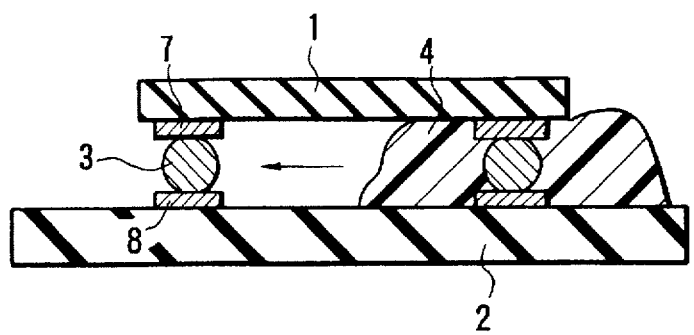
FIGS. 14A and 14B are sectional views showing a chip and a circuit board for explaining sealing of the present invention and conventional resin sealing.
Figure 14B:
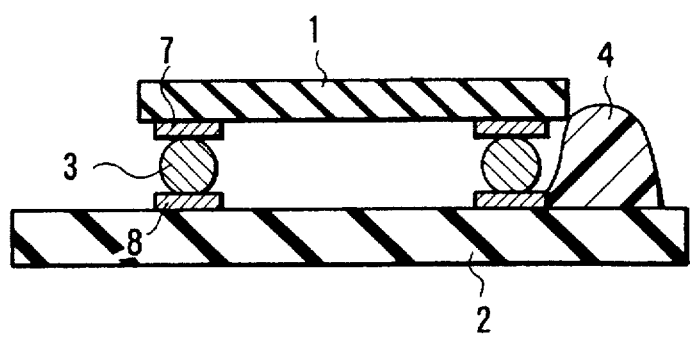

As shown in FIG. 14A, in this embodiment, when a resin for the sealing member is dropped from a nozzle (not shown) to the gate region, the resin enters the central portion of the surface of the chip 1 by the capillary phenomenon in gap between the chip and the circuit board. As a result, the sealing member 4 is formed.

In such a bump arrangement, by injecting a resin to be filled from the gate region on the chip corner portion, the resin can be filled in the central portion of the surface of the chip even if the resin has a high filler content or a filler diameter is larger than the interval between the bumps.

The second embodiment will be described below with reference to FIG. 4.

In this embodiment, bumps 3 are formed in a gate region 5. The gate regions 5 need not be formed all the corner portions of the chip 1, and the gate region 5 may be formed only on a predetermined corner portion or portions. The gate region 5 has a substantially square shape. The bumps 3 are arranged in the gate region 5 of the chip 1. In a conventional chip, the bumps 3 are arrayed at predetermined intervals along each side of the peripheral portion of the chip, and the bump arrays extend to the corner portions. In this embodiment, however, every other bump 6 indicated by a dotted line in the gate region 5 is removed to increase the interval of the bump array in the gate region 5 (i.e., a bump concentration in the gate region is lower than that in another region). The resin dropped from a resin supply nozzle flows into the gap between the chip and the circuit board through the intervals between the bumps 3 in the gate region 5. When the resin is dropped from the resin supply nozzle near the gate region, the resin enters the central portion of the surface of the chip 1 by the capillary phenomenon between the chip and the circuit board therethrough to be a sealing member 4. In this manner, since a bump concentration in the gate region decreases, a uniform sealing member free from voids is formed between the chip and the circuit board. In addition, in such a bump arrangement, a filling resin is injected from the gate region on the corner portion of the chip. For this reason, even if the filling resin has a high filler content, and a filler diameter is larger than a bump interval, the resin can be preferably filled in the central portion of the chip.

The third embodiment will be described below with reference to FIG. 5.

In this embodiment, as in the second embodiment, bumps 3 are also formed in a gate region 5. The gate region 5 is formed on each of all the corner portions of a chip 1, or on only a predetermined corner portion or portions. The gate region 5 has a substantially square shape. In this embodiment, a bump pitch of a bump array on the chip 1 in the gate region is different from that in another region, and the interval between the bumps in the gate region 5 is large. The resin flows into the space between the chip 1 and the circuit board through the intervals of the bumps 3 in the gate region 5 as indicated by arrows. More specifically, a bump pitch (e.g., 200 μm) in the gate region 5 is larger than a bump pitch p2 in another region (p1>p2). When the resin is dropped from a resin supply nozzle to the gate region, the resin enters the central portion of the surface of the chip 1 by the capillary phenomenon between the chip and the circuit board to be a sealing member 4.

Since the gate region is formed as described above, a uniform sealing member free from voids is formed between the chip and the circuit board. In addition, in such a bump arrangement, a filling resin is injected from the gate region on the corner portion of the chip. For this reason, even if the filling resin has a high filler content, and a filler diameter is larger than a bump interval, the resin can be preferably filled in the central portion of the surface of the chip. In addition, as in this embodiment, when the bumps are formed in the gate region as in this embodiment, the number of bumps can be made smaller than that of the first embodiment.

Fourth embodiment will be described below with reference to FIG. 6.

FIG. 6 is a plan view showing a part of a chip. A chip 1 comprises bumps 3 through pad electrodes (not shown). The bumps 3 are arranged along each side of the peripheral portion of the chip 1. The chip 1 is flip chip mounted on a circuit board, and a sealing member 4 such as an epoxy resin is filled in a portion between the chip and the circuit board. Gate regions 5 are formed on all the corner portions on a major surface of the chip 1. A resin is injected from at least one of the four gate regions 5 into the portion between the chip and the circuit board. In this embodiment, although the gate regions 5 are formed on all the corner portions, a gate region may be formed on only a predetermined corner portion or portions.

In this embodiment, each gate region 5 has a substantially rectangular shape. More specifically, one gate regions 5 of the chip 1 is formed on a corner constituted by a first side (h)

and a second side (h2) adjacent to the first side, and a length h1 of the gate region along the first side is longer than a length h2 of the gate region along the second side (h1>h2). No bump 3 is arranged in the gate region 5.

In a conventional chip, as indicated by a dotted line, bumps 6 are arranged in the corner portion. For this reason, the resin cannot enter in the space between the chip 1 and the circuit board 2, and a gate region is not formed on the corner portion. Since, however, in this embodiment, no bump is formed, the resin easily enters the space between the chip and the circuit board by a capillary phenomenon as indicated by an arrow. In this gate region 5, three bumps 6 of the bump array along the first side (h1) and two bumps 6 of the bump array along the second side (h2) (the bump at the point where the first side crosses the second side is shared by the bump arrays along the first and second sides) are removed. When the resin enters the space between the chip 1 and the circuit board 2 from the gate region 5, if the gate region has a square shape, the resin flows in a direction almost perpendicular to the diagonal line of the gate region 5 toward the central portion of the chip 1. Since, however, the gate region 5 in this embodiment has a rectangular shape, the resin flows in a direction which is slightly shifted from the center of the chip 1 as indicated by an arrow in FIG. 6.

In such a bump arrangement, a filling resin is injected from the gate region on the corner portion of the chip. For this reason, even if the filling resin has a high filler content, and a filler diameter is larger than a bump interval, the resin can be preferably filled in the central portion of the chip.

The fifth embodiment will be described below with reference to FIG. 7.

FIG. 7 is a plan view showing a circuit board to which four chips are attached, and shows positions for filling a resin in the chips. As in a chip 11, a resin may be filled from one portion of the corner portions of the chip. However, depending on a chip size or a chip shape, a resin may be filled from two diagonal portions as in chip 12, or a resin may be filled from two portion of the same side as in a chip 13. As in a chip 14, a square gate region 51 is formed, and a rectangular gate region 53 is formed at a diagonal position of the gate region 51. In this case, since the flow of resin is shifted from the central point of the chip 14, uniform filling is performed in such a manner that the resin flowing from the gate region 53 does not collide with the resin flowing from the gate region 51. In resin injecting, the flow of resin is preferably ruled to have one direction, and resin filling from all the corners are preferably avoided because voids are easily formed. However, when rectangular gate regions are formed on all the corner portions of the chip, all the flows of resin can be shifted from the central point of the chip. For this reason, uniform filling can be performed.

In this manner, uniform sealing can be performed depending on the shape or position of a gate region.

The sixth embodiment will be described below with reference to FIG. 8.

The number of bumps in a chip 1 tends to increase with high-density packing of a semiconductor device. In such a state, the following arrangement is effective, and copes with an increase in number of bumps. That is, bumps are arranged in a staggered form along each side of the chip, i.e., arranged in such a manner that bumps of one of two bump arrays are located at positions corresponding to the intervals between the bumps of the other of the two bump arrays. The present invention can also be applied to the bumps arranged in a staggered form.

Figure 15:
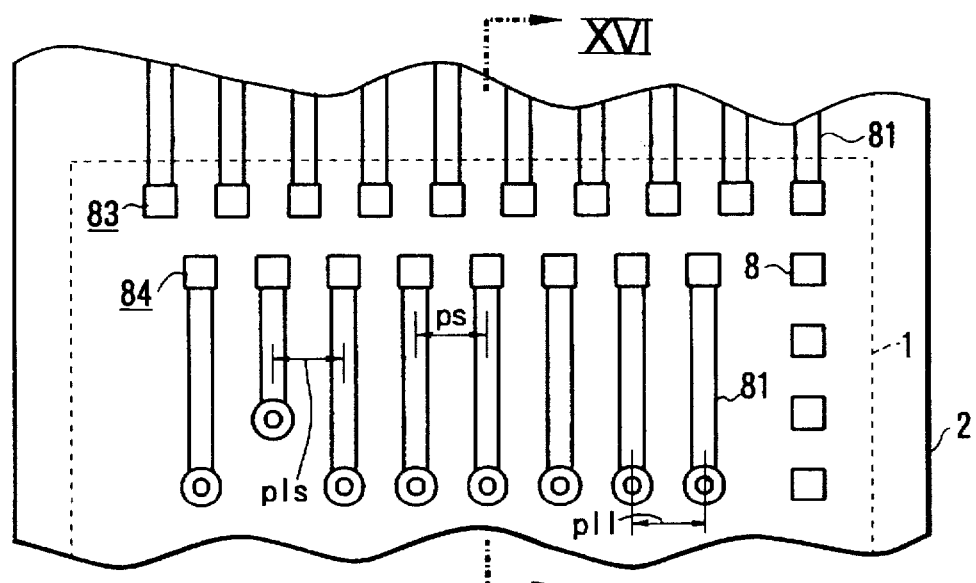
FIG. 15 is a plan view showing a part of a circuit board of a conventional semiconductor device.
Figure 16:
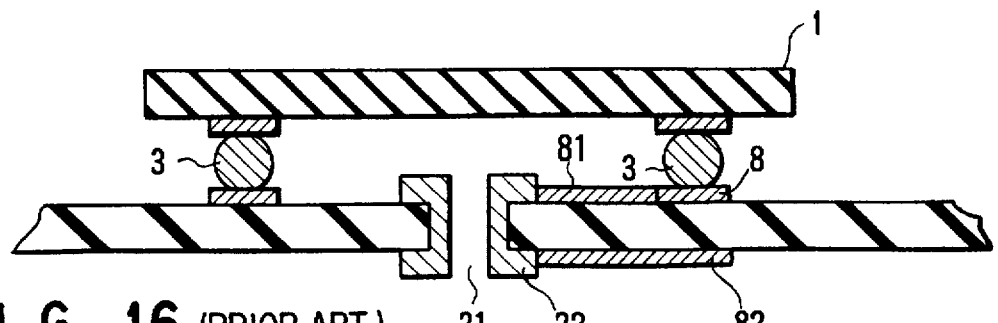
FIG. 16 is a sectional view showing a chip and a circuit board along an XVI—XVI in FIG. 15.

FIG. 8 is a plan view showing a part of a semiconductor chip 1. The chip 1 comprises bumps 3 through pad electrodes (not shown). The bumps 3 are arranged in two arrays along each side of the peripheral portion of the surface of the chip 1, and the bumps of these arrays are arranged in a staggered form. The plurality of bumps 3 on the chip 1 are connected to board-on pads connected to wiring patterns formed on the surface of the circuit board. Since the bumps 3 of the chip 1 are arranged in a staggered form, the board-on pads of the circuit board are arranged in a staggered form as shown in FIG. 15. In addition, a sealing member such as an epoxy resin is filled between the chip 1 and a circuit board. A gate region 5 having no bumps is formed on a corner portion of the major surface of the chip 1 on which the bumps 3 are formed.

A resin is injected from the gate region 5 to the space between the chip and the circuit board. In this embodiment, the gate regions 5 need not be formed all the corner portions of the chip 1, and the gate region 5 is preferably formed only on a predetermined corner portion or portions. In this embodiment, a wiring pitch on the circuit board ruled by the wiring limit of the circuit board is represented by ps (see FIG. 15), the bump pitch of the outer array of the bumps arranged in the staggered form in the chip is represented by p1, and the bump pitch of the inner array is represented by p2. In this case, the embodiment is characterized in that p2≧ps is satisfied. In addition, the bump pitch of the inner array is set to be larger than that of the outer array (p2>p1). The wiring pitch ps of the circuit board is set to be equal to a smaller one of a minimum interval p1s between a through hole land and a wire and a minimum interval p11 between a plurality of through hole lands. When the bumps are arranged as described above, and through hole lands 22 are formed as shown in FIG. 15, an optimum bump arrangement is performed.

Therefore, a semiconductor device in which flip chip mounting is performed and which can prevent an increase in substrate cost and cumbersome wiring and has resin filling properties can be provided.

Figure 9:
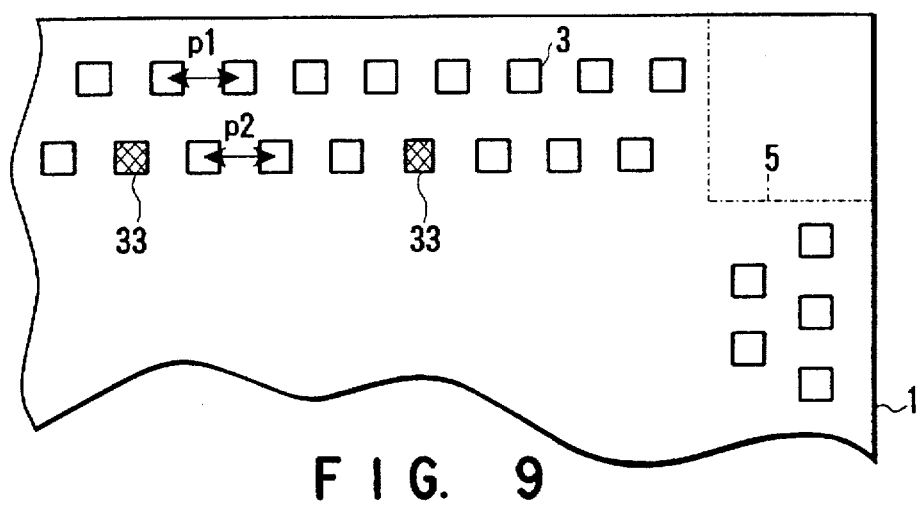
FIG. 9 is a plan view showing a part of a modification of a semiconductor chip used in a semiconductor device according to the sixth embodiment.

FIG. 9 shows a modification of the embodiment shown in FIG. 8, and is a plan view showing a part of a semiconductor chip. A wiring pitch ruled by the wiring limit of a circuit board is represented by ps (see FIG. 15), the bump pitch of the outer array of the bumps arranged in the staggered form in the chip is represented by p1, and the bump pitch of the inner array is represented by p2. When the wiring pitch ps on the pad arrangement of the circuit board must be larger than the bump pitch p2 of the inner array of the chip (ps>p2), a reduction value (a/b) of (ps/p2) is calculated. With reference to the relationship between the integer numbers of the numerator/denominator, the number of bumps arranged in the inner array is set to be a, (a−b) or more bumps of the a bumps in the inner array are not connected. Note that it is assumed that the bump pitch p1 of the outer array is equal to the bump pitch p2 of the inner array (p1=p2). That is, in FIG. 9, each bump 33 are not wired.

Since the bumps are arranged as described above, an optimum bump arrangement is performed when through hole lands which occupy a large area are formed in the circuit board. Therefore, a semiconductor device in which flip chip mounting is performed and which can prevent an increase in substrate cost and cumbersome wiring and has resin filling properties can be provided. A gate region 5 is formed on a corner portion of the chip.

Figure 10:
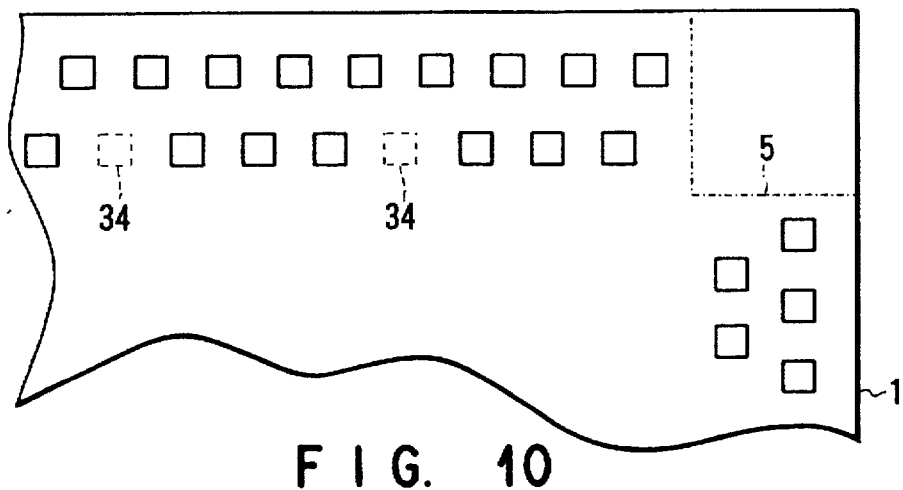
FIG. 10 is a plan view showing a part of another modification of a semiconductor chip used in a semiconductor device according to the sixth embodiment.

FIG. 10 shows another modification of the embodiment in FIG. 8, and is a plan view showing a part of a semiconductor chip. A wiring pitch ruled by the wiring limit of a circuit board is represented by ps (see FIG. 15), the bump pitch of the outer array of the bumps arranged in the staggered form in the chip is represented by p1, and the bump pitch of the inner array is represented by p2. When the wiring pitch ps on the pad arrangement of the circuit board must be larger than the bump pitch p2 of the inner array of the chip (ps>p2), a reduction value (a/b) of (ps/p2) is calculated. With reference to the relationship between the integer numbers of the numerator/denominator, the number of bumps arranged in the inner array is set to be b, the b bumps are arranged at the pitch p2, and a space in which (a-b) bumps are not arranged is formed. More specifically, the positions of bumps 34 which are not actually arranged are formed as empty spaces. The empty spaces may be regularly arranged as shown in FIG. 10. However, when the number of empty spaces is equal to or larger than a predetermined value, the empty spaces may be properly arranged according to the chip specification.

On a corner portion of the chip, a gate region 5 is formed to smoothly fill a resin as in FIGS. 8 and 9.

In each of the cases in FIGS. 8, 9, and 10, when bumps arranged in a staggered form in three or more arrays are used, the same bump arranging method can be used. Methods of determining the number of bumps are different from each other in these cases. More specifically, a wiring pitch ruled by the wiring limit of the circuit board is represented by ps, and a chip size is represented by 1c. In this case, the total number of bumps of inner arrays except the outermost array is ruled to be smaller than an integer number which is smaller than (1c/ps)×4 and is closest to the value, bump arrangements follow the cases in FIGS. 8, 9, and 10, respectively.

In a semiconductor device according to the present invention, the length of one side of a gate region on a corner portion of a semiconductor chip is properly set to be about 200 μm to 1 mm. A bump pitch can be set to be about 100 to 300 μm or more.

According to the present invention, when the number of bumps, a bump pitch, and a bump arrangement are optimized, an increase in substrate cost can be suppressed, and the injection properties and workability of filling resin can be improved.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor element having a plurality of projection electrodes formed along each side of a peripheral portion on a major surface;

a circuit board having a major surface on which a plurality of pad electrodes are formed, said pad electrodes joining said projection electrodes of said semiconductor element; and a sealing member filled between said semiconductor element and said circuit board;

wherein a gate region in which said sealing member is injected is formed on a corner portion of said semiconductor element, and wherein said plurality of projection electrodes are arranged at predetermined intervals on the major surface of said semiconductor element, and the predetermined interval of the projection electrodes in said gate region is larger than the predetermined interval of the projection electrodes in another region.

2. A semiconductor device according to claim 1, wherein the shape of said gate region is a square or rectangular shape having two adjacent sides constituting a corner of said semiconductor element.

3. A semiconductor device according to claim 2, wherein said plurality of projection electrodes are arranged in a staggered form.

4. A semiconductor device according to claim 1, wherein said projection electrodes are arranged in two arrays along each side of the peripheral portion on the major surface, intervals between the projection electrodes arranged in the inner array of the two arrays being larger than intervals between the projection electrodes arranged in the outer array of the two arrays.

5. A semiconductor device according to claim 1, wherein said projection electrodes are arranged in two arrays along each side of the peripheral portion on the major surface, selected ones of the projection electrodes arranged in the inner array of the two arrays being removed.

* * * * *